(12) United States Patent
Sung et al.

(10) Patent No.: US 6,372,042 B1
(45) Date of Patent: Apr. 16, 2002

(54) SYSTEM FOR PROCESSING SEMICONDUCTOR WAFERS PRODUCING A DOWNWARD LAMINAR FLOW OF CLEAN AIR IN FRONT OF BAKING UNITS

(75) Inventors: Woo-dong Sung, Suwon; Sam-soon Han, Yongin; Chang-wook Oh, Yongin; Jeong-lim Nam, Yongin, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/482,537

(22) Filed: Jan. 14, 2000

(30) Foreign Application Priority Data

Mar. 4, 1999 (KR) ............................................. 99-7120

(51) Int. Cl.$^7$ ...................... B05C 11/02; B05C 13/00; B01L 1/04; F27B 5/14
(52) U.S. Cl. ............................ 118/52; 118/59; 118/66; 454/187; 432/202
(58) Field of Search ................................ 118/70, 50, 52, 118/50.1, 58, 66, 620, 641, 319, 320, 59; 454/187; 55/385.2, 484; 432/200, 201, 202, 207, 231, 249, 247, 42, 48, 81, 233, 77

(56) References Cited

U.S. PATENT DOCUMENTS

| | | | |
|---|---|---|---|
| 4,946,484 A | * | 8/1990 | Monson et al. ............. 55/385.2 |
| 5,639,301 A | * | 6/1997 | Sasada et al. .................. 118/52 |
| 5,928,390 A | * | 7/1999 | Yaegashi et al. ............ 29/25.01 |
| 6,007,595 A | * | 12/1999 | Baik et al. .................. 55/385.2 |
| 6,046,439 A | * | 4/2000 | Johnsgard et al. ....... 219/444.1 |

OTHER PUBLICATIONS

Perry's Chemical Engineers' Handbook, 7th. Ed., 1997, McGraw–Hill, pp. 1–9, 28–29, 11–68, 11–69, 11–70, 11–73.*
Perry's Chemical Engineers' Handbook, 4th Ed., 1963, McGraw–Hill, p. 23–54.*
Handbook of Chemistry and Physics, 52$^{nd}$ Ed., Chemical Rubber Co., p. F–55.*

* cited by examiner

Primary Examiner—Richard Crispino
Assistant Examiner—Kevin P. Shortsle
(74) Attorney, Agent, or Firm—Volentine Francos, PLLC

(57) ABSTRACT

A photo process system for semiconductor wafers prevents air from flowing across the top of a baking region to produce a stable downward laminar air flow in front of baking units disposed at several levels in the baking region. The baking region is located on one side of a housing, and a coating unit for coating a wafer with a photoresist is located on the other side of the housing. The housing has a clean air entrance and air filters at an upper portion thereof, and a clean air discharge opening at the very bottom thereof. An air flow containment dam prevents clean air entering the housing from flowing horizontally at the top of the baking region. Such a horizontal flow of air would otherwise produce turbulence severely affecting the ability of the air to flow downward across the front of the baking units and toward the discharge opening as a laminar air flow. The laminar air flow hardly passes into the baking units and thus, hardly induces temperature variations in the coated wafers that are being baked. Accordingly, the thickness of the photoresist film on the wafer becomes highly uniform, as does the critical dimension of a pattern produced from the film. Also, dust or ionic contaminants are directly discharged through the discharge opening at the bottom of the housing by the downward laminar flow of clean air. The wafers within the baking units are prevented from being contaminated, thereby enhancing the yield of the semiconductor products.

10 Claims, 10 Drawing Sheets

SYSTEM FOR PROCESSING SEMICONDUCTOR WAFERS PRODUCING A DOWNWARD LAMINAR FLOW OF CLEAN AIR IN FRONT OF BAKING UNITS

BACKGROUND OF THE INVENTION

1. Field of the Invention

The present invention relates to a photo process system for use in the manufacturing of semiconductor wafers. More particularly, the present invention relates to a photo process system for forming a high quality photoresist film on a semiconductor wafer.

2. Description of the Related Art

The fabrication of semiconductor devices includes a photo process comprising steps of forming a photoresist film on a wafer, exposing the photoresist film to define a predetermined pattern thereon, and developing the exposed photoresist to form a film of the predetermined pattern on the wafer.

In clustered systems whose use has been increasing as of recent, all of the units of equipment for performing the photo process, for example, a coating unit, a developing unit, a baking unit, and the like, are clustered in one place. Therefore, the distance between the units, and hence, the time required to move a wafer from one unit to the next, is relatively short. Thus, the photo process can be performed efficiently by such equipment.

FIG. 1 is a schematic of the layout of a conventional clustered photo process system.

As shown in FIG. 1, a robot 110 for transferring a wafer is installed at the center of a housing 100. The robot 110 is surrounded by a coating unit 120, a developing unit 130, a baking unit 140, a loading/unloading unit 150, and a controller 160.

The coating unit 120 executes a spin coating method in which the wafer is rotated at a predetermined speed, and the rotating wafer is coated with a photoresist. The photoresist is dispersed uniformly over the surface of the wafer due to the centrifugal force of the rotating the wafer.

The developing unit 130 develops a pattern formed on the photoresist film in the exposure step, and the baking unit 140 bakes the wafer at a predetermined temperature between the above-described steps.

The loading/unloading unit 150 both loads the wafer into the system and unloads a completely processed wafer from the system. The loading/unloading unit 150 is designed to support several wafer carriers at a time.

The controller 160 includes a computer system for controlling the units of photo processing system. The robot 110 has a support 111 fixed to the bottom surface of the housing 100, and an arm 112 which is integrated with the support 111 and can move freely. The arm 112 moves a wafer between the units within the housing 100.

The steps of the photo process performed by the conventional photo process system will now be described generally.

In a pre-baking step (1), a wafer is introduced via a wafer carrier into the loading/unloading unit 150. From there, the wafer is transferred to the baking unit 140 by the robot 110. In the baking unit 140, the wafer is heated to a predetermined temperature which causes organic material or foreign material to evaporate from the surface of the wafer.

In a photoresist (PR) coating step (2), the resultant wafer is transferred to the coating unit 120. A photoresist film is formed on the surface of the wafer by the coating unit 120.

In a soft baking step (3), the wafer is transferred back to the baking unit 140 where the wafer is heated for a predetermined amount of time. In this step, the photoresist is dried so that it attaches firmly to the surface of the wafer.

In an exposure step (4), the wafer is transferred to an exposure unit, such as a stepper or scanner. The photoresist film is photo-sensitized by the exposure unit to define a pattern thereon.

In a post-exposure baking (PEB) step (5), the exposed wafer is transferred back to the baking unit 140. The wafer is again heated for a predetermined amount of time by the baking unit 140.

In a developing step (6), the wafer is cooled to a temperature within a predetermined range. Subsequently, the photoresist pattern is developed by the developing unit 130.

In a hard baking step (7), the wafer is heated so that the photoresist pattern will be even more firmly attached to the surface of the wafer.

The above-described steps are performed in a clean environment in which the temperature and humidity are controlled, and in which dust or other foreign materials have been eliminated. Thus, the photo process system is installed within a clean room provided with an air conditioner.

In the PEB step, optically-decomposed resins are rearranged due to thermal diffusion by heating the exposed photoresist at a predetermined temperature, thus cleaning the profile boundary (cross section) between exposed patterns. This PEB step is performed to prevent abnormalities from being produced in the profile of the patterns and non-uniformity of the critical dimension of the patterns when the patterns are irradiated with ultraviolet (UV) or deep ultraviolet (DUV) light during the exposure process. Because light irradiating the exposed portion diffracts and produces interference according to the reflectivity and refractivity of the wafer and the optical absorption level of the photoresist, the diffraction and interference of the light would create the above-mentioned abnormalities and non-uniformity in the exposed portion if the resins were not rearranged by being heated prior to exposure.

The problems posed by these optical phenomena of diffraction and interference can alternatively be solved by coating the photoresist film with an anti-reflection film prior to exposure. However, the PEB process is used more often.

When the exposure light in the photo process is a DUV light, a chemically-amplified resist is used as the photoresist. A portion of the chemically-amplified resist, which is exposed by thermal treatment, changes into an acid which is soluble in a developing solution. Also, the alteration of the chemically-amplified resist occurs due to a chain reaction, so that the balance of heat applied to the entire wafer in the PEB step has the greatest effect on the uniformity of the critical dimension of a pattern.

FIG. 2 is a schematic diagram of a conventional photo process system installed in a clean room.

Referring to FIG. 2, the clean room typically has a passageway 10 and an equipment installation zone 20. The photo process system is located in the equipment installation zone 20, adjacent to the passageway 10. The upper portion of the clean room is provided with an upper plenum 30 through which clean air enters the room, and the lower portion of the clean room is provided with a lower plenum 40 through which air is discharged from the room. Filters 31 are installed between the upper plenum 30 and the equipment installation zone 20 and passageway 10 of the clean room. The photo process system has a housing 100, a coating unit 120 disposed in the housing 100 at one side thereof, and baking unit shelves 140a disposed in the housing 100 at the other side thereof. A plurality of baking units 140 are installed in multiple stages on the baking unit shelves 140a. A robot 110 is installed at the center of the housing 100.

The air conditioner of the photo process system includes a blower 171, blast pipes 172, and an air filter 173. The blower 171 is installed within the lower plenum 40, the air filter 173 is installed in the upper portion of the housing 100, and the blast pipes 172 extend from the blower 171 to the upper portion of the housing 100 in which the air filter 173 is provided. The blower 171 typically includes a chemical filter for removing $NH_3$ from the air.

In the clean room, dust in the equipment installation zone 20 is a prevented from entering the housing 100, and different pressures are maintained in different areas of the clean room to prevent fumes or the like from diffusing from one area to another. For example, the pressure in the passageway 10 is about 0.17 to 0.18 $mmH_2O$ greater than that in the upper area of the housing 100. The pressure in the passageway 10 is about 0.07 to 0.08 $mmH_2O$ greater than that in the housing 100. The pressure in the housing 100 is about 0.09 to 0.12 $mmH_2O$ greater than that in the equipment installation zone 20. The pressure in the equipment installation zone 20 is about 0.60 to 0.70 $mmH_2O$ greater than that in the lower plenum 40. The pressure in the passageway 10 is greater by about 0.71 to 0.82 $mmH_2O$ than that in the lower plenum 40. The pressure in the housing 100 is greater by about 0.02 to 0.082 $mmH_2O$ than that in the baking unit 140. The pressure in the baking unit 140 is greater by about 0.06 to 0.08 $mmH_2O$ than the pressure at the exterior of the rear surface the baking unit 140.

Due to these pressure differences, clean air flows from the upper plenum 30 to the lower plenum 40 via the passageway 10, the interior of the housing 100, and the equipment installation zone 20. The bottom of the passageway 10 and the housing 100 is typically formed of gratings, and the clean air flows through these gratings into the lower plenum 40. Clean air entering the housing 100 from the passageway 10 passes sequentially through the coating unit 120 and the front surface, the interior and the rear surface of the baking unit 140, and enters the lower plenum 40 through the rear surface of the housing 100.

FIG. 3 shows the flow of clean air within a conventional photo process system.

As shown in FIG. 3, clean air flowing through the blast pipes 172 enters the housing 100 via the air filter 173. Here, the amount of clean air entering the housing 100 is controlled by dampers 174 provided in the blast pipes 172. The clean air entering the housing 100 forms a downwardly flowing air current within the housing 100. A grating 101 at the lower portion of the housing 100 allows clean air to pass therethrough, but the bottom surface 102 of the housing 100 is completely closed. Consequently, the clean air is discharged to the outside of the housing 100 via air vents 103 provided on the lower rear surface of the housing 100. Hence, clean air enters a baking unit shelf 140a on which a baking unit 140 is installed, from the front portion of the baking unit, and is discharged out the rear portion of the baking unit.

In the prior art, the upper surface of a highest baking unit shelf 140a is spaced a predetermined distance below the air filter 173, whereby an empty space 140b is formed between the highest baking unit shelf 140a and the air filter 173. Accordingly, clean air entering the space 140b impinges the upper surface of the highest baking unit shelf 140a and becomes turbulent. Then, the turbulent clean air exits the space 140b and joins the downwardly flowing air current. The turbulent clean air at the front portion of the baking unit shelf 140a is so excessive that it impedes the clean air from flowing downwardly as a laminar flow of air. The turbulent air current induced adjacent to the baking unit shelf 140a flows into the baking unit 140 having a lower pressure.

Therefore, the flow of clean air is not completely laminar in the housing 100 of the conventional photo process system. Also, the way in which clean air flows into the baking unit shelves 140a on which the baking units 140 causes parts of the baking unit shelves 140a to have different temperatures. Thus, parts of a wafer loaded within the baking unit 140 are baked at different temperatures, respectively. For example, as air of a temperature lower than that in the baking unit flows into the baking unit from the front portion thereof, a part of the wafer closest to the front portion of the baking unit shelf 140a comes into contact with the clean air, whereby the temperature of the part of the wafer closest to the front portion of the baking unit shelf 140a becomes less than that of the other part of the wafer.

Furthermore, the baking unit 140 is clustered with a cooling water line and a variety of utility pipes and boards which cause the temperature within different parts of the baking unit 140 to even further deviate from the norm. According to experiments, a cooling water line adjacent the baking unit 140 causes the baking unit shelf 140a to have internal temperatures differing by about 1° C. This non-uniformity in the temperature results in non-uniformity in the thickness of the photoresist film and in the critical dimension in the photoresist pattern.

SUMMARY OF THE INVENTION

An object of the present invention is to provide a photo process system for semiconductor wafers which can produce a photoresist film having a highly uniform thickness and a pattern from the photoresist having a highly uniform critical dimension.

Accordingly, to achieve the above object, the present invention provides a photo process system for semiconductor wafers in which clean air entering the system from an upper portion of a housing, in which the baking units are located, is constrained to flow downward as a laminar air current within the housing past the front of the baking units. To produce the laminar air flow, the discharge opening is formed at the bottom of the housing, and an air flow containment dam prevents clean air entering said housing from flowing horizontally at the top of the baking region. Such a horizontal flow of air would otherwise produce turbulence severely affecting the ability of the air to flow downward across the front of the baking units and toward the discharge opening as a laminar air flow.

BRIEF DESCRIPTION OF THE DRAWINGS

The above and other objects, features and advantages of the present invention will become more apparent by referring to the following detailed description of preferred embodiments thereof made with reference to the attached drawings, of which.

DETAILED DESCRIPTION OF THE PREFERRED EMBODIMENTS

Figure 1:
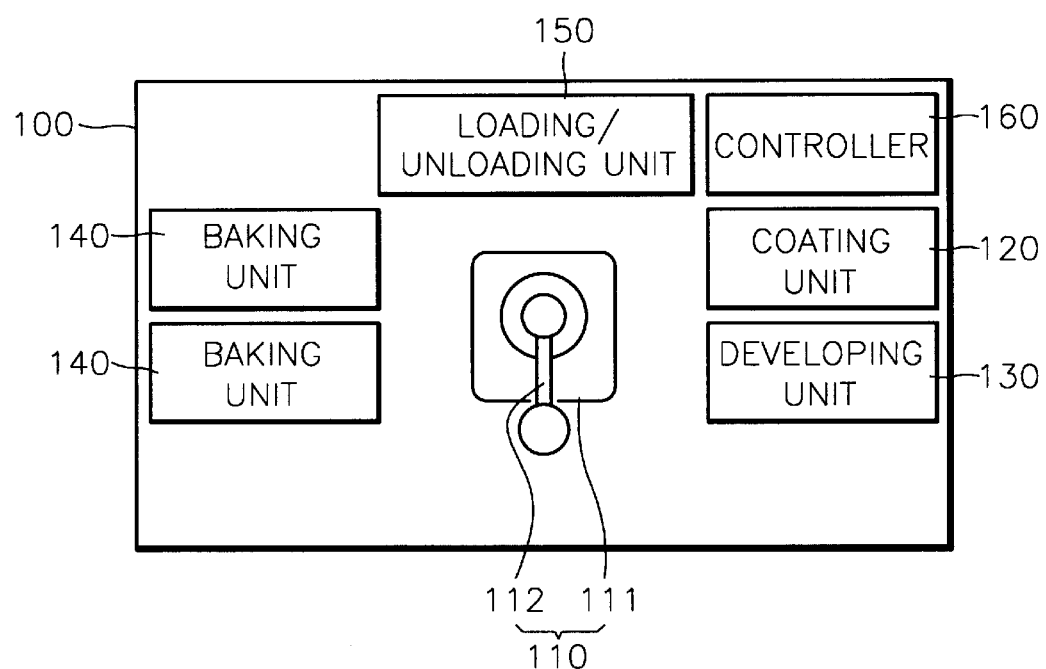
FIG. 1 is a schematic diagram of the configuration of a conventional photo process system.
Figure 2:
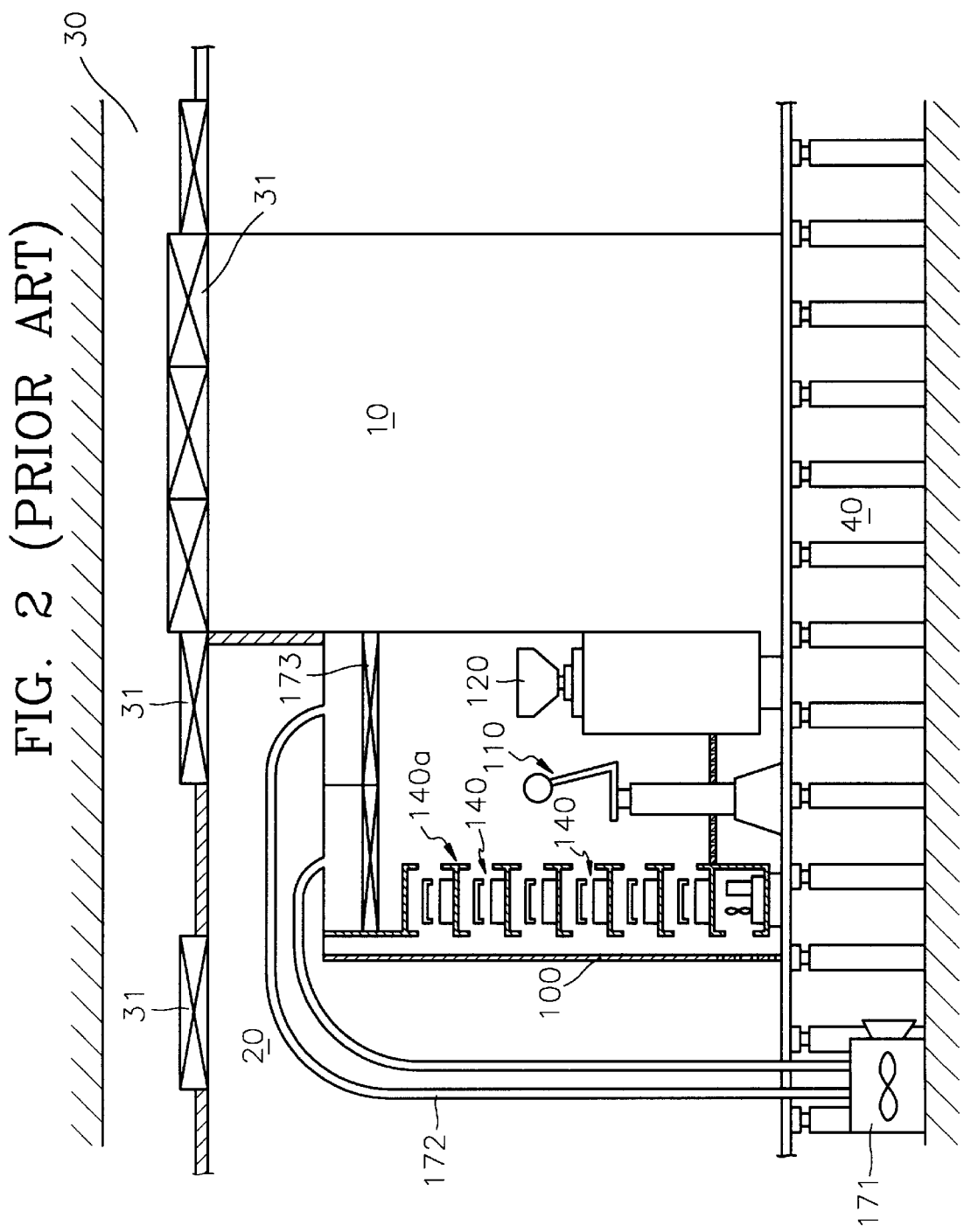
FIG. 2 is a vertical cross-sectional view of a conventional photo process system installed in a clean room.
Figure 3:
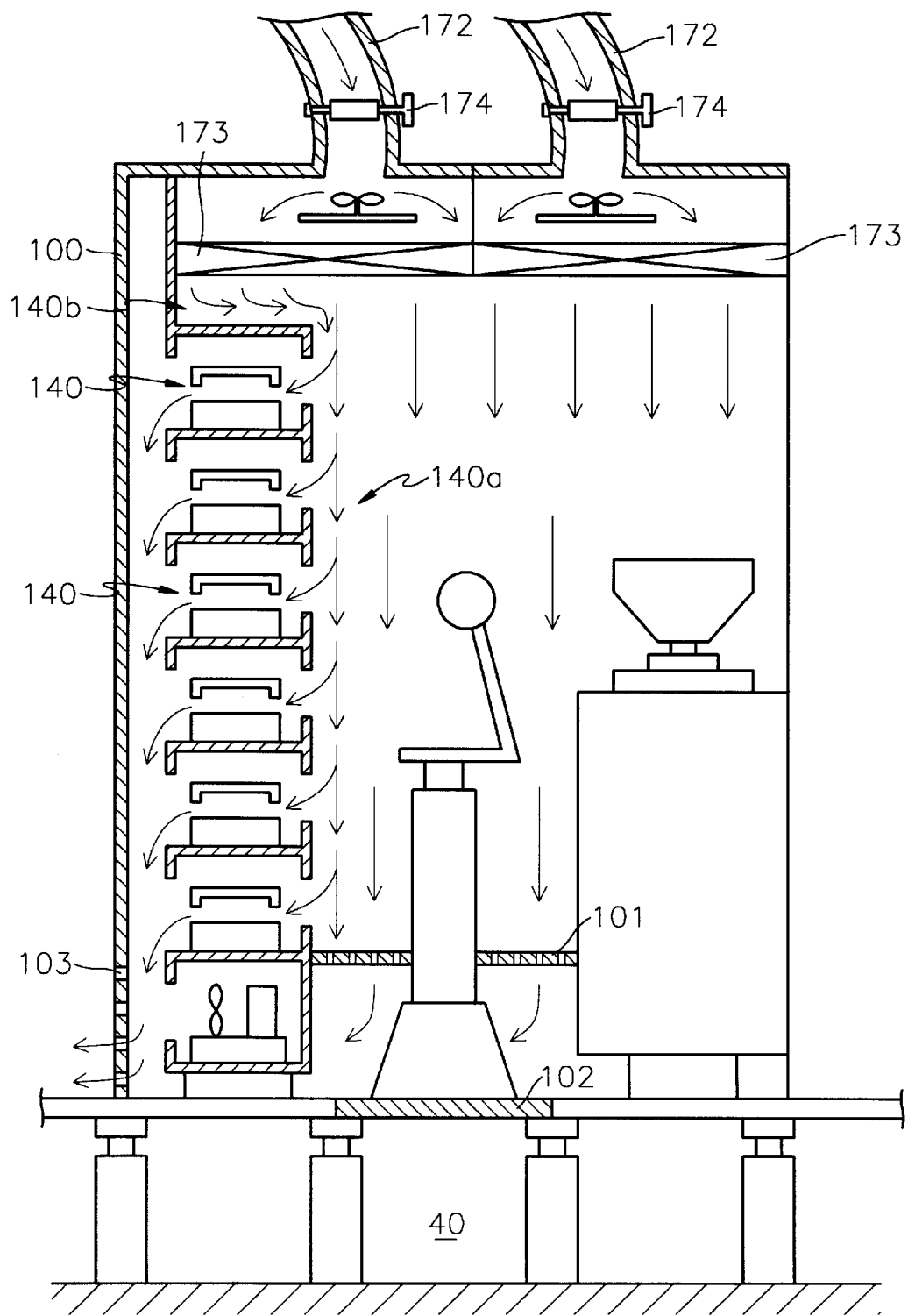
FIG. 3 is an enlargement of a portion of the conventional photo process system shown in FIG. 2, showing the flow of clean air in the system.
Figure 4:
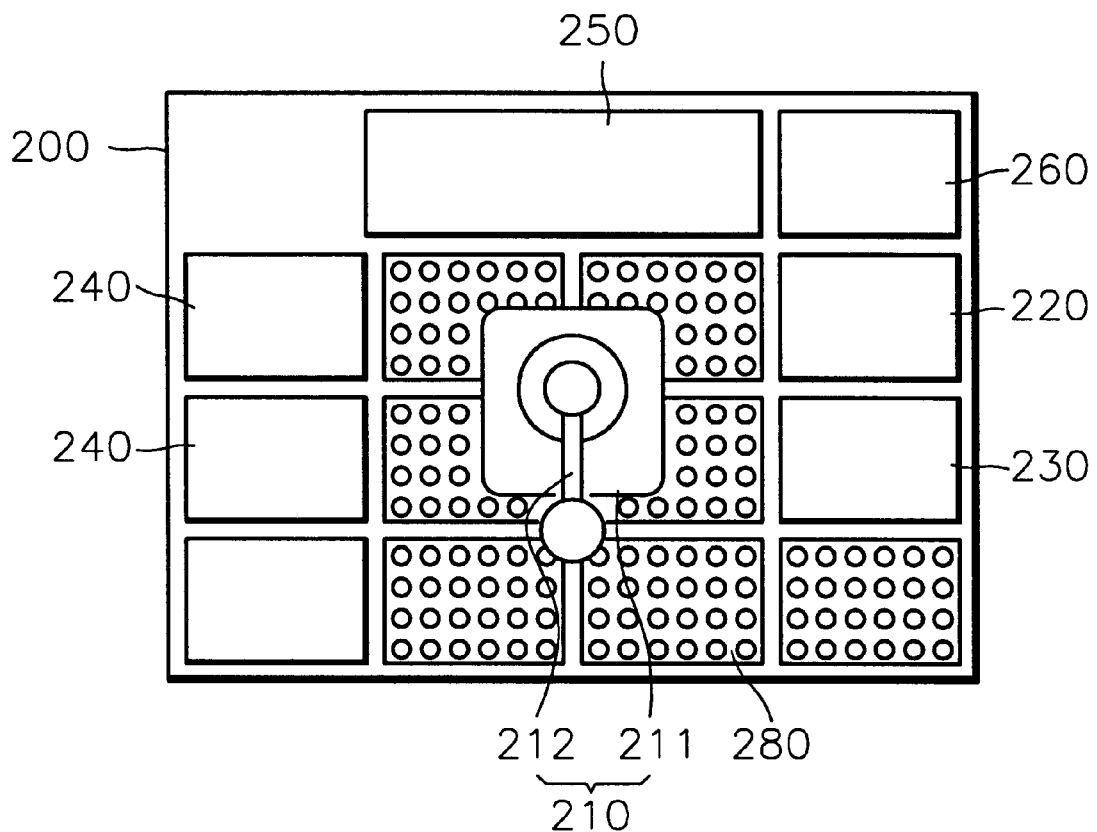
FIG. 4 is a schematic plan view of a photo process system according to the present invention.
Figure 5:
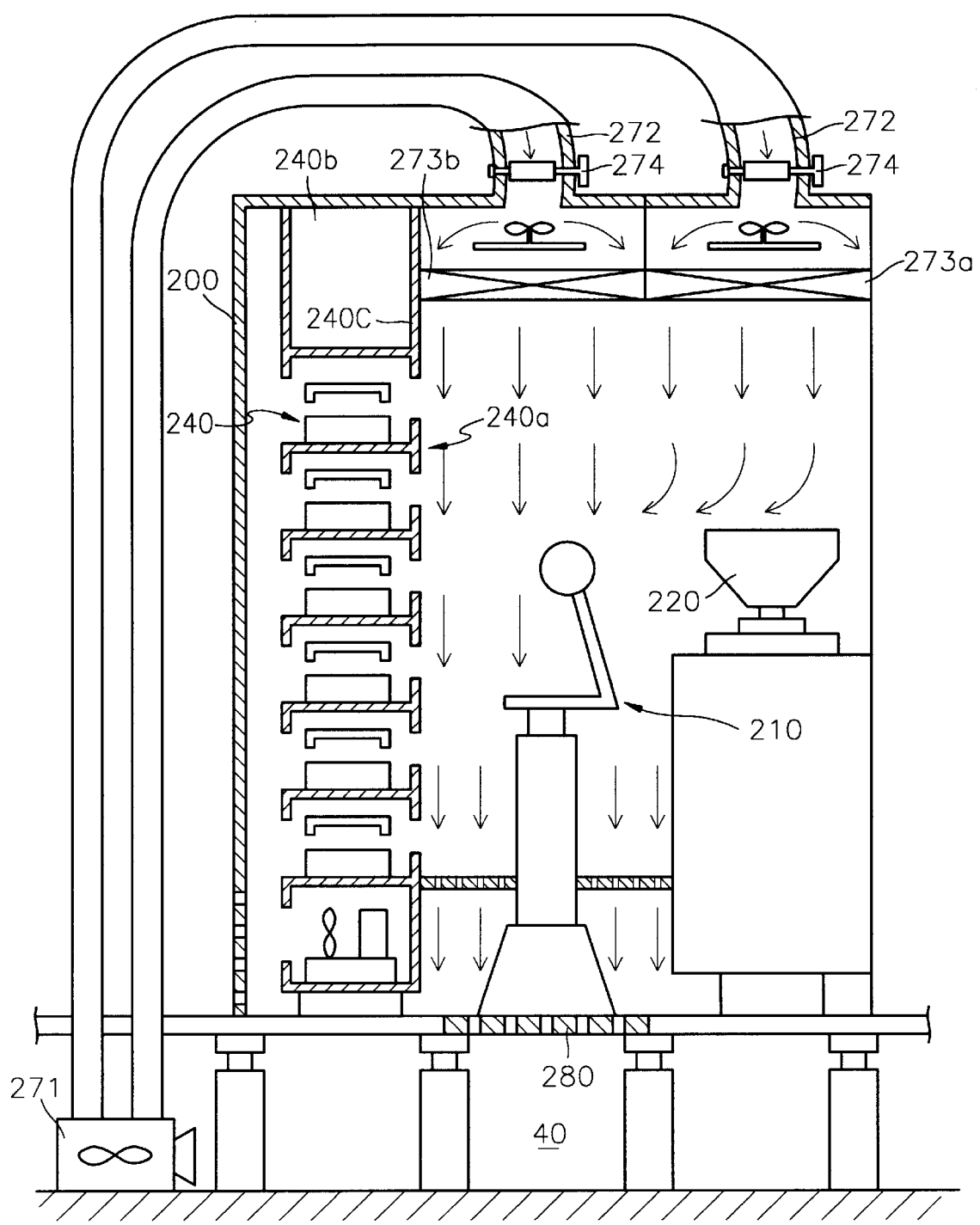
FIG. 5 is a vertical sectional view of a preferred embodiment of the photo process system according to the present invention, showing the flow of clean air in the system.

Referring to FIGS. 4 and 5, a photo process system according to the present invention includes a spin coating unit 220 for coating a semiconductor wafer with a liquid photoresist film, a developing unit 230 for developing a pattern formed on the photoresist film by an exposure unit, and baking unit shelving 240a on which baking units 240 for baking the wafer at a predetermined temperature are installed in multiple stages.

The baking unit shelving 240a is disposed at one side of a housing 200 defining a baking region. The coating unit 220 and the developing unit 230 are disposed at the other side of the housing 200. A robot 210 for transferring a wafer between units is installed at the approximate center of the housing 100. The robot 210 includes a support 211 fixed to the bottom of the housing 200, and an arm 212 integrated with the support 211 for transferring a wafer between units of the photo process system. A loading/unloading unit 250 for loading a wafer into the system or unloading the wafer therefrom, and a controller 260 for manipulating and controlling the system are provided at the front of the housing 200.

Also, an air conditioner for supplying clean air into the housing 200 is included. The air conditioner includes a blower 271 installed in the lower plenum 40, blast pipes 272 for connecting the blower 271 to the upper surface of the housing 200, and air filters 273a and 273b installed on the housing 200 for filtering clean air supplied through the blast pipes 272.

As a characterizing feature of the present invention, the air filters 273a and 273b are installed at specific air inflow areas of the housing 200: a first air filter 273a is located directly over the coating unit 220, and a second air filter 273b is located directly over the robot 210. Each of the air filters 273a and 273b may comprises a plurality of discrete filter units. An air flow containment dam in the form of a wall 240c encloses the space 240b directly over the baking unit shelving 240a so that clean air does not flow into the space 240b above the baking unit shelving 240a.

Thus, clean air supplied through the first and second air filters 273a and 273b flows downward within the housing 200 as a laminar air flow. The vertical downward laminar flow of the clean air significantly suppresses the flow of clean air into the baking region.

As another characterizing feature of the photo process system according to the present invention, a grating 280 constitutes the bottom of the housing 200. The clean air supplied from the upper portion of the housing 200 is kept laminar all the way to the bottom of the housing 200 by the plurality of air vents of the grating 280 which allow the clean air to discharge freely into the lower plenum 40.

The rate at which clean air is supplied into the housing 200 can be controlled by dampers 274 installed in the blast pipes 272. The rate at which clean air is discharged from the housing 200 can be designed for by selecting an appropriate size of the air vents of the grating 280. Therefore, local pressure differences within the housing can be minimized to stabilize the laminar air flow. Moreover, the downward laminar flow of clean air within the housing 200 causes dust or fumes to be smoothly discharged through the grating 280, thus preventing such dust or the like from diffusing toward the coating unit 220 or the baking unit shelving 240a where it would cause defects on the surfaces of the wafers.

Also, the flow rate of clean air supplied through the first air filter 273a is preferably greater than the flow rate of clean air supplied through the second air filter 273b. For example, the flow rate of clean air supplied through the first air filter 273a can be set to be 0.3 m/sec, and the flow rate of clean air supplied through the second air filter 273b can be set to be 0.2 m/sec. The flow rate of clean air supplied through the first air filter 273a is greater than the flow rate of clean air supplied through the second air filter 273b to prevent dust or the like produced near the robot 210 from flowing toward the coating unit 220 and the developing unit 230.

Figure 6:
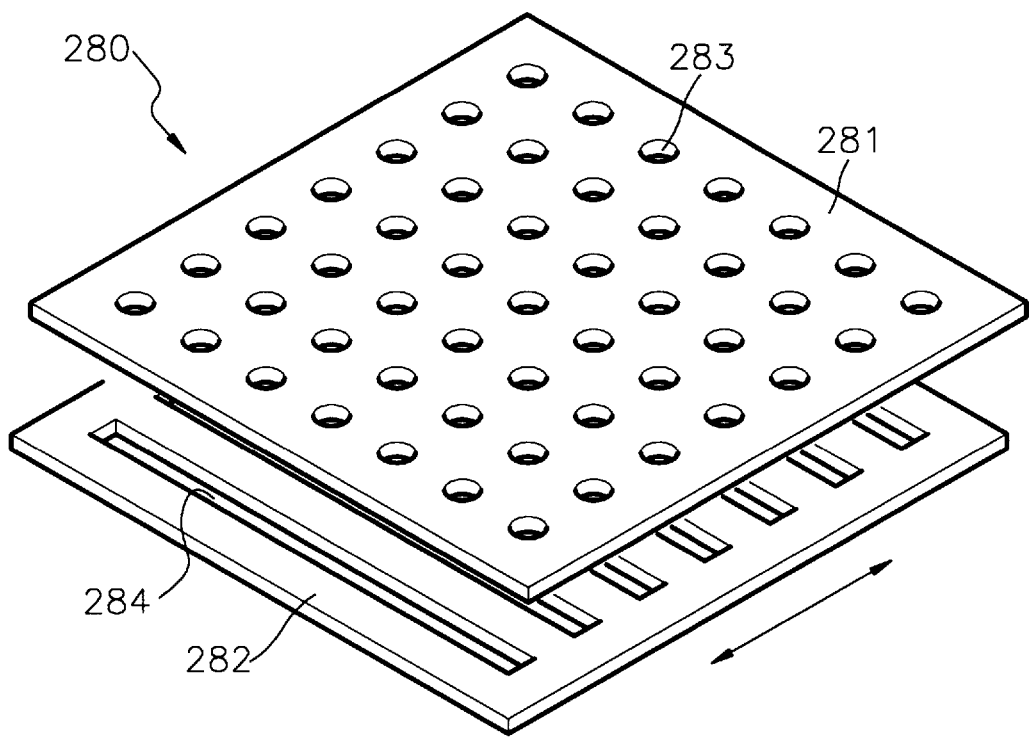
FIG. 6 is a perspective view of a grating of the photo process system according to the present invention.
Figure 7:
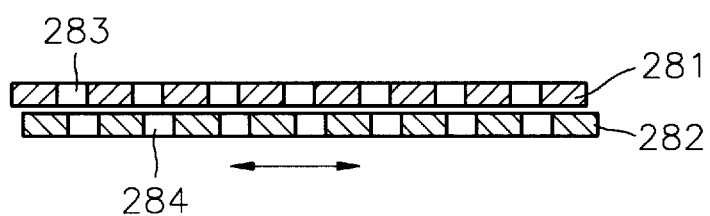
FIG. 7 is a cross-sectional view of the grating of FIG. 6.

Referring to FIGS. 6 and 7, the grating 280 at the bottom of the housing 200 is configured so that the effective area of the openings leading from the housing 200 to the bottom plenum 40 can be controlled. For this purpose, the grating 280 has a two-tiered structure which includes a fixed plate 281 fixed to a bottom wall portion of the housing, and a moving plate 282 installed under the fixed plate 281. The moving plate 282 can be shifted with respect to the fixed plate 281. The fixed plate 281 has a plurality of air vents 283 spaced at predetermined intervals from one another, and the moving plate 282 has a plurality of slits 284 also spaced at predetermined intervals from one another. Accordingly, the effective area of the discharge opening of the grating 280 corresponds to the degree to which the slits 284 are overlapped by the air vents 283. The moving plate 282 can be reciprocated relative to the fixed plate 280 by any appropriate linearly reciprocating mechanism (not shown).

As described above, since the area of the discharge opening of the grating 280 can be controlled, the flow rate and pressure of clean air within the housing can be regulated to impart stability to the laminar flow of clean air. Also, any difference in pressure between the inside and outside of the baking unit shelving 140a can be reduced or eliminated. The reduction or elimination of the pressure difference prevents clean air from flowing into the baking region.

Figure 8:
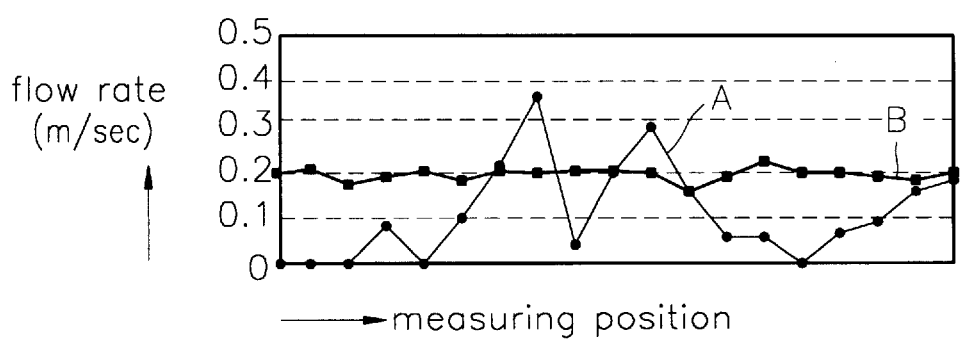
FIG. 8 is a graph showing the flow rates of clean air at different positions in the photo process system according to the present invention and in the conventional photo process system.

FIG. 8 is a graph showing the flow rate of clean air at different positions across a photo process system according to the present invention and within a conventional photo process system, as taken in an area located 15 cm beneath the air filters.

As is clear from plot (A), showing the flow rates of clean air in a conventional system, the flow rate at the center of the housing is significantly faster than at both sides of the housing. Such a difference between flow rates at different areas of the housing gives rise to a pressure differential which causes clean air to flow from the center of the housing toward both sides of the housing. Clean air moving toward the side of the housing where the baking unit shelving is located inevitably flows into the baking region.

On the other hand, as is clear from plot (B), the flow rates of clean air at different positions across the photo process system according to the present invention are relatively uniform. These uniform flow rates minimize or prevent any pressure differential from occurring within the housing so that the clean air flowing to the lower portion of the housing is kept from flowing horizontally. Thus, air is prevented from flowing into the baking unit shelving. Again, the flow rates of clean air at different positions within the housing can be made uniform by controlling the effective area of the discharge opening of the grating, as described above.

The following Table 1 shows the difference in pressure between the environments inside and outside the baking region, and the resultant deviation of the line widths of a patterned photoresist film on a wafer baked on the shelving.

TABLE 1

Pressure Differential Effect on Critical Dimension

| Classification | Pressure Difference Between Environments of Baking Unit Shelving and Inside of Housing | Deviation of Line Widths of Critical Dimension |
| --- | --- | --- |
| (a) | 0.02 to 0.08 mm $H_2O$ | 50 nm or more |
| (b) | 0.00 mm $H_2O$ | 35 nm or less |

The above data is obtained by measuring the deviation of the critical dimensions of the patterns after a photoresist flow is induced by a PEB process at 120° C. Classification (a) in Table 1 represents the case of a wafer processed by the conventional photo process system, and classification (b) represents the case of a wafer processed by the photo process system according to the present invention.

As can be seen from Table 1, in the conventional photo process system, a pressure difference exists between the environments within the baking unit shelving and outside the baking unit shelving (within the housing). Consequently, the critical dimension of a pattern on the wafer after a photoresist flow process has a deviation of 50 nm or more. However, according to the present invention, there is no pressure difference between the environments existing inside the baking unit shelving and the inside of the housing. Thus, clean air is prevented from flowing into the baking unit shelving. Thus, the temperature within the baking unit shelving is kept constant. Accordingly, the deviation of the critical dimension of a pattern formed on a wafer baked in the baking unit shelving is kept to 35 nm or less.

Figure 9:
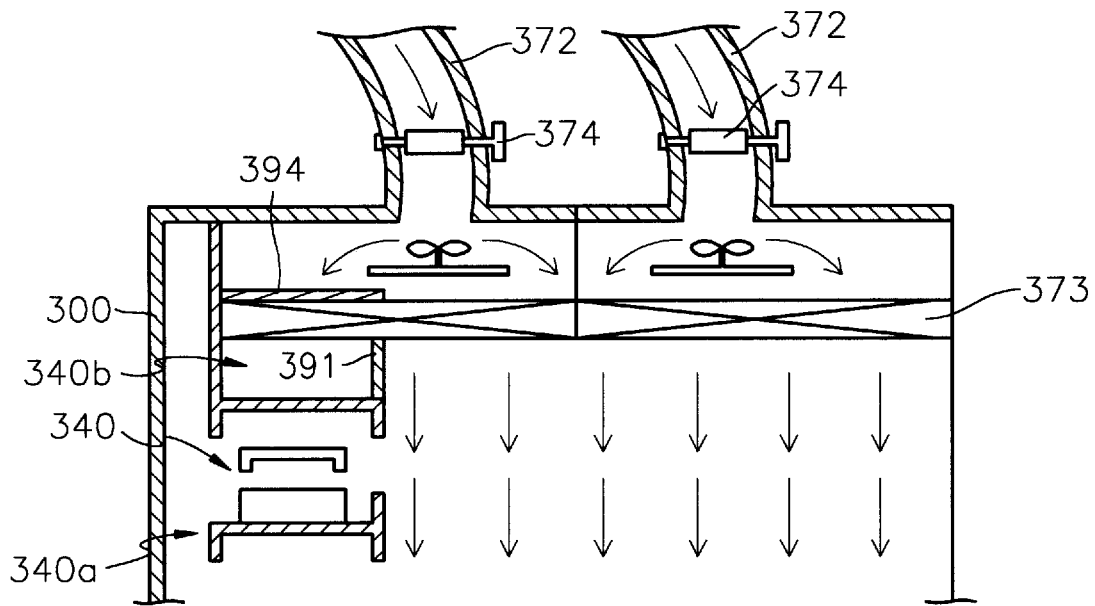
FIG. 9 is a vertical sectional view of the upper portion of another embodiment of a photo process system according to the present invention.
Figure 10:
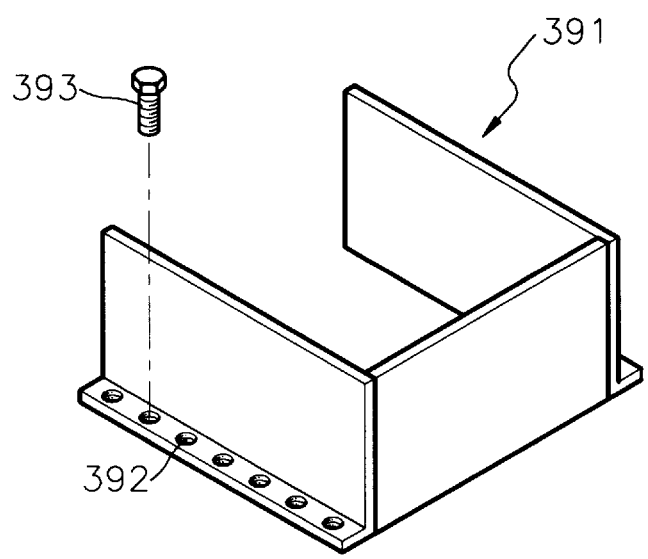
FIG. 10 is a perspective view of a shadow wall of the photo process system shown in FIG. 9.

In another embodiment of a photo process system according to the present invention shown in FIG. 9, an air filter 373 installed in the air inflow region at the upper portion of the housing 300 extends into the baking region over baking unit shelving 340a. An air containment dam in the form of a shadow box 391 encloses the space 340b existing above the baking unit shelving 340a and beneath the air filter unit 373. An optional shadow plate 394 can be provided opposite the shadow box 391 on the upper surface of the air filter. As shown in FIG. 10, the shadow box 391 has bottom flanges provided with bolt holes 392 . The shadow box 391 is fixed to the upper surface of the baking unit shelf 340a by bolts 393 passed through the bolt holes 392. The shadow plate 394 prevents clean air supplied through blast pipes 372 from flowing into a portion of the air filter 373 located directly above the baking unit shelving 340a, whereas the shadow box 391 prevents air from flowing into and from the space 340b above the baking unit shelving 340a.

Therefore, air at the top of the baking unit shelving 340a is prevented from becoming turbulent so that air entering the housing from the filter 373 flows downward in a laminar state. Thus, the amount of clean air flowing into the baking unit shelving 340a is minimal. The amount of clean air supplied into the housing 300 through two air filters 373 can be controlled by dampers 374 so that the clean air is supplied uniformly to different areas within the housing 300.

Figure 11:
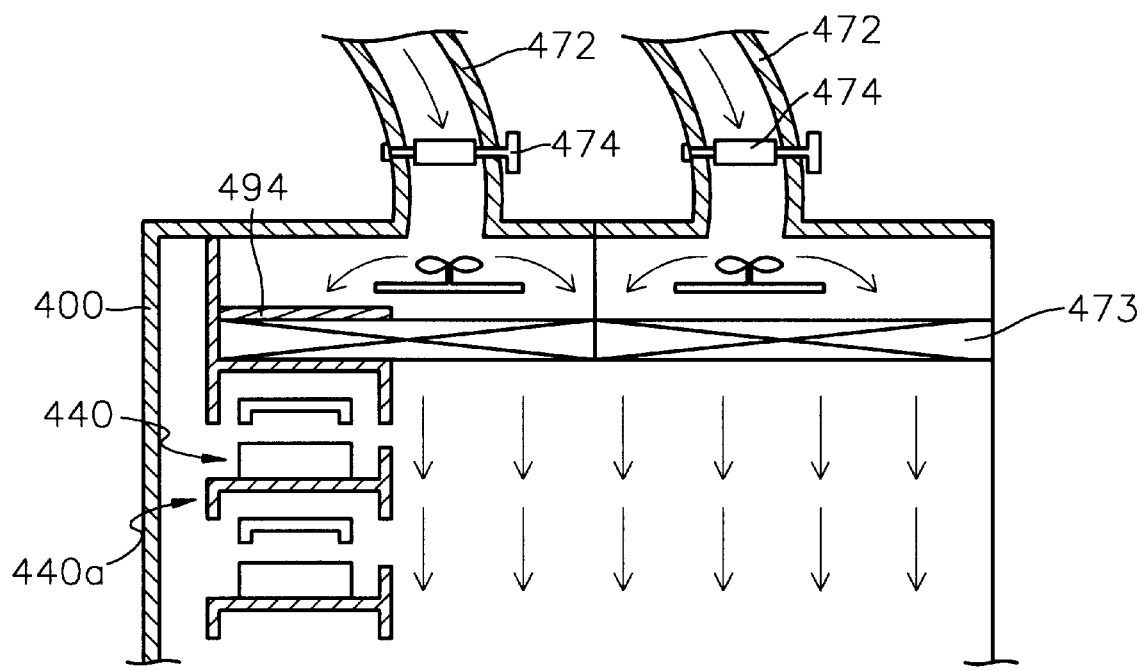
FIG. 11 is a vertical sectional view of the upper portion of still another embodiment of a photo process system according to the present invention.

Referring to FIG. 11 showing still another embodiment of a photo process system according to the present invention, an air containment dam in the form of an uppermost shelf of baking unit shelving 440a contacts the lower surface of an air filter 473 so that no air space exists between the baking shelf unit and the air filter 473. An optional shadow plate 494 can be provided on the upper surface of that portion of the air filter 473 which contacts the shelf.

Hence, clean air supplied to the housing 400 through blast pipes 472 is prevented from flowing horizontally between the top of the baking unit shelving 400a and the air filter 473. Thus, air entering the housing from the filter 473 flows downward as a laminar air current, and the amount of clean air entering the baking region is minimal. The amount of clean air supplied into the housing 400 through two air filters 473 can be controlled by dampers 474 so that the flow rate of clean air is uniform throughout the different areas of the housing.

Figure 12:
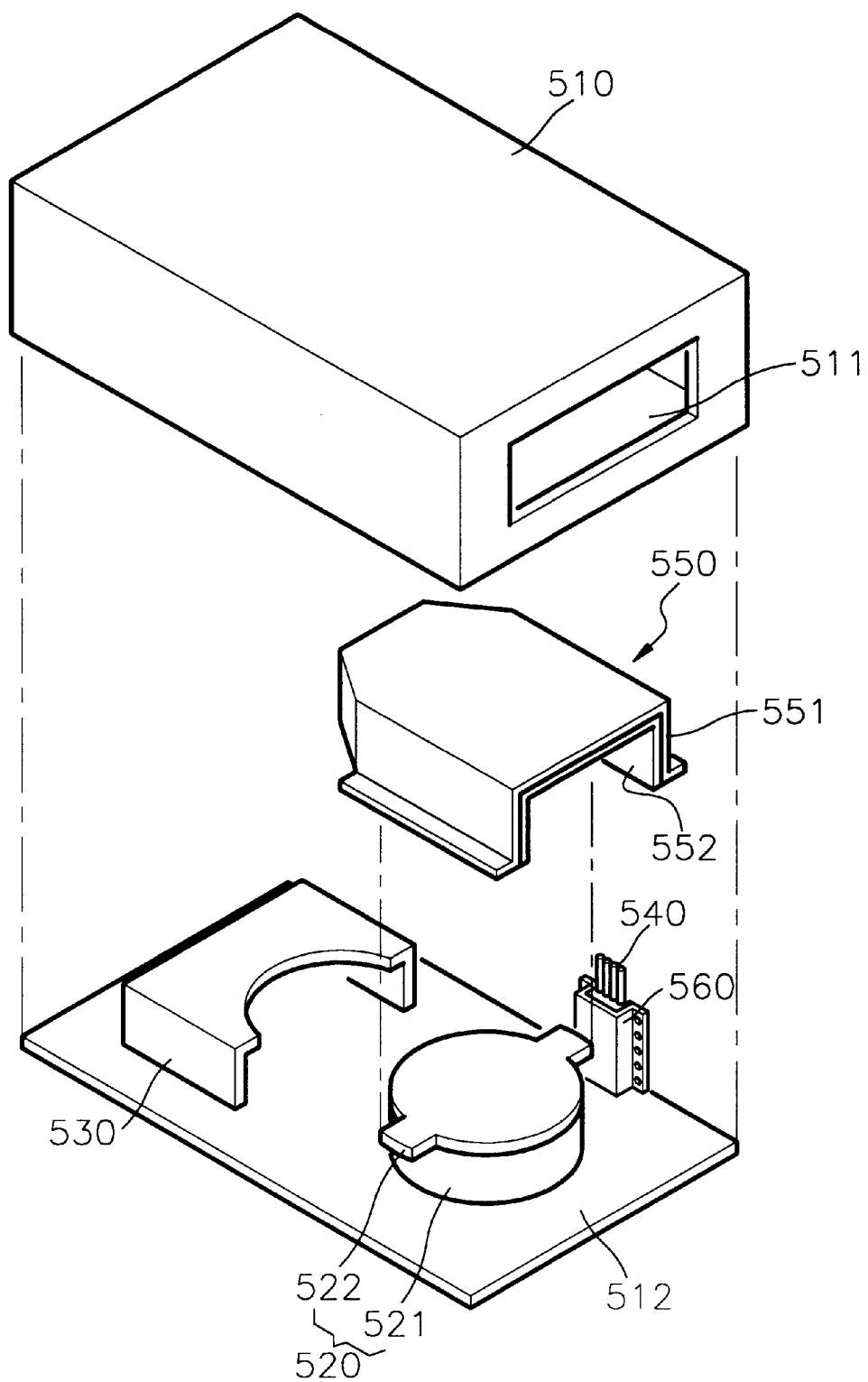
FIG. 12 is an exploded perspective view of a baking unit of the photo process system according to the present invention.
Figure 13:
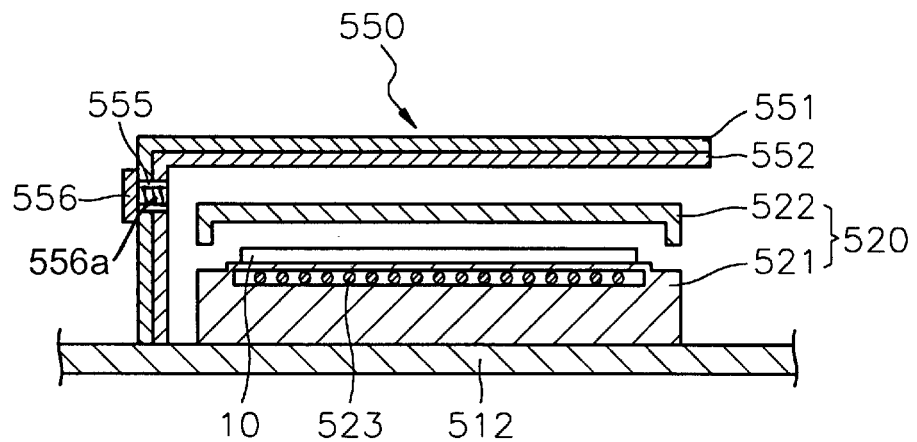
FIG. 13 is a vertical cross-sectional view of the baking unit of FIG. 12.
Figure 14:
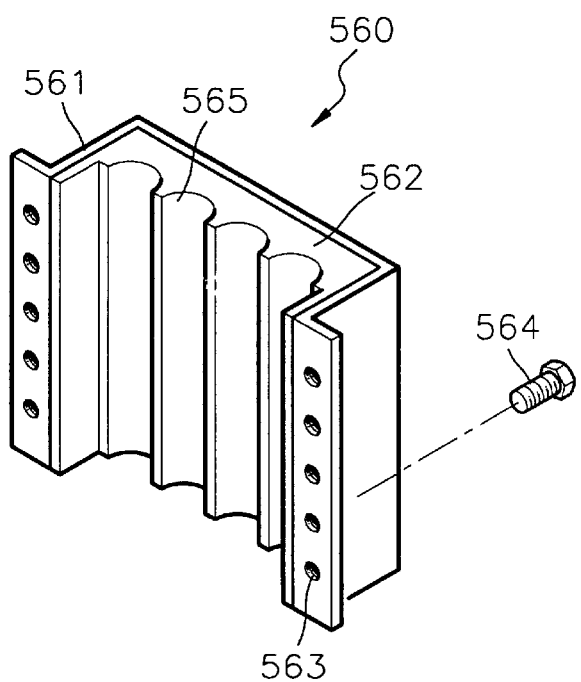
FIG. 14 is a perspective view of the shadow wall of the photo process system shown in FIG. 12.

Next, FIGS. 12 through 14 show a baking unit of the present invention. The baking unit includes a case having a top plate 510 and a bottom plate 512. The top plate has wafer entrance 511 through which a wafer 10 is loaded into the unit. The rear end of the case is open. A baking chamber 520 for baking the wafer 10 at a predetermined temperature is provided within the case 510. The baking chamber 520 includes a lower plate 521 which rests on the bottom plate 512 of the case, a heater 523 for heating the wafer 10, and an upper plate 522 which is supported so that it can be raised and lowered relative to the lower plate 521 by an elevating means (not shown). After the wafer 10 is loaded on the lower plate 521, the upper plate 522 is lowered to cover the wafer 10.

The baking chamber 520 is surrounded by a board installation portion 530 which supports various utility pipes and boards, and cooling water lines 540 for cooling the baking chamber 520. The board installation portion 530 and cooling water lines 540 have a thermal effect which, if left unchecked, would create temperature variations across the baking chamber 520 or lower the temperature of the baking chamber 520. Therefore, the baking unit includes a thermal insulator for protecting the baking chamber 520 from external thermal effects. The thermal insulator can include an insulating cover 550 for thermally insulating the baking chamber 520, and an insulating plate 560 covering the cooling water lines 540.

The insulating cover 550 covers the baking chamber 520, and the lower surface of the insulating cover 550 is attached to the bottom plate 512 of the case of the baking unit. The front of the insulating cover 550 is open so that the wafer 10 can enter and leave the baking chamber 520. The insulating cover 550 and insulating plate 560 serve to maintain the temperature of a wafer 10 within the baking chamber 520 uniform.

Preferably, the insulating cover 550 comprises an outer plate 551 and an inner plate 552. The outer plate 551 is made of a stainless material and maintains the shape of the insulating cover 550. The outer plate 551 is formed by press-molding a sheet of the stainless material, e.g. stainless steel, in order to avoid the use of welding as much as possible during the manufacture process. The surface of the outer plate 551 is polished to prevent foreign matter such as dust from being generated and adhering thereto. The inner plate 552 is made of a synthetic resin having excellent heat resistance and heat insulation properties, such as Teflon (PVDF). Also, the inner plate 552 is preferably made of a material which is not easily deformed by heat and which does not produce dust or ionic contaminants.

As shown in FIG. 13, an air vent 555 is formed in the rear wall of the insulating cover 550, and a knob 556 is provided over the air vent 555 to control the degree to which the air vent 555 can be opened. A respective air vent 555 and knob 556 is provided on the left side and on the right side of the rear wall of the insulating cover 550 so that the clean air flows uniformly within the insulating cover 550. Thus, the temperature at the left and right sides of the wafer 10 will be uniform. Also, the knob 556 preferably has graduations 556a to allow the degree to which the air vent 555 is open to be discerned from the knob.

The insulating plate 560 shields the cooling water lines 540, thus preventing the temperature at the side of the baking chamber 520 adjacent the cooling water lines 540 from being reduced. Thus, the lines 540 are prevented from causing temperature differences across a wafer 10 loaded within the baking chamber. The insulating plate 560 preferably also comprises an outer plate 561 made of stainless steel and an inner plate 562 made of synthetic resin having excellent heat resistance, as shown in FIG. 14. The outer plate has flanges at both sides thereof. Bolt insertion holes 563 are formed through the flanges. The insulating plate 560 can be attached to the sidewall of the case 510 by passing bolts 564 through the bolt insertion holes 563. The outer plate 561 is formed by press-molding a sheet of the stainless material in order to avoid the use of welding as much as possible during the manufacture process. The surface of the outer plate 561 is polished to prevent foreign matter such as dust from being generated and adhering thereto. Grooves 565 are formed on the inner surface of the inner plate 562 to accommodate the cooling water lines.

In the photo process system according to the present invention as described above, a downward laminar flow of clean air is effectively and stably produced within the housing, thereby suppressing the flow of clean air into the baking shelf unit. Furthermore, the cooling water lines within the baking shelf unit are prevented from exerting a thermal influence on a wafer in the baking chamber of the unit. Accordingly, the temperature across the wafer can be kept uniform. Therefore, the photo process system of the present invention can produce a photoresist film on the wafer having a highly uniform thickness and a photoresist pattern having a highly uniform critical dimension.

Also, clean air within the housing is directly discharged through the grating at the bottom of the housing due to the laminar characteristic of the air flow. Thus, the interior of the housing is kept quite clean and wafers within the housing are prevented from being contaminated by dust or the like. Therefore, the present invention contributes to increasing the yield of the semiconductor products.

Although the present invention has been described above with respect to particular embodiments thereof, many modifications thereof will become readily apparent to those of ordinary skill in the art. Thus, all such modifications are seen to be within the true spirit and scope of the invention as defined by the appended claims.

What is claimed is:

1. A system for processing semiconductor wafers, comprising:

a housing having an upper portion defining a clean air entrance through which clean air is introduced into the housing, a bottom wall defining a discharge opening through which clean air is discharged from the housing, a first side therein defining a baking region of the system, and a second side therein defining a coating region of the system spaced from said baking region;

a plurality of air filters disposed at the clean air entrance of said housing;

a plurality of layers of baking units disposed at said baking region in the housing;

a coating unit for coating wafers with photoresist, said coating unit being disposed at the coating region in said housing and resting on said bottom wall of the housing;

a robot interposed between the baking region and the coating region for transferring wafers between the baking units and the coating unit, said robot resting on the bottom wall of said housing;

an air supply unit for supplying clean air into said housing via the clean air entrance at the upper portion of the housing; and an air flow dam configured to prevent clean air entering said housing via said clean air entrance from flowing horizontally at the top of said baking region and thereby constrain the air to flow downward toward said discharge opening as a laminar current at a side of the baking units facing toward said coating region;

wherein each of said baking units comprises a case having a front wall in which a wafer entrance is formed, and an open rear; a baking chamber within said case, the baking chamber having a lower plate, a heater mounted to said lower plate, and an upper plate extending over said lower plate and mounted in the unit so as to be movable up and down relative to said lower plate; and a thermal insulator shielding the baking chamber;

wherein said thermal insulator is an insulating cover covering said baking chamber, said insulating cover having an open front sized to admit a wafer to the baking chamber; and wherein said insulating cover has air vents at left and right sides of a rear surface thereof opposite the open front of the insulating cover, and knobs by which the degree to which the air vents are open can be adjusted.

2. The processing system of claim 1, wherein each of the knobs is graduated so that the degree to which the air vents are open can be discerned from said knobs.

3. The processing system of claim 1, wherein said bottom of said housing comprises a grating having a plurality of air vents constituting said discharge opening.

4. The processing system of claim 3, wherein said grating has means for varying the area of said discharge opening.

5. The processing system of claim 1, wherein said air filters include a first air filter disposed directly above said robot and terminating at said baking region, and a second air filter disposed directly over said coating area, and said air flow dam is located at the top of said baking region adjacent said first air filter.

6. The processing system of claim 5, wherein the first and second air filters each comprise a plurality of discrete air filter units.

7. The processing system of claim 5, and further comprising damper means for allowing the flow rate of clean air passing through the first and second air filters to be adjusted relative to one another.

8. The processing system of claim 1, wherein one of said air filters extends into the baking region at the top thereof, a space is defined between said one of the filter units and an uppermost one of said baking units in said baking region, and said air flow dam comprises a box isolating said space from a region within said housing in which clean air flows from said clean air entrance to said discharge opening.

9. The processing system of claim 1, wherein one of said air filters extends into the baking region at the top thereof, and said air flow dam comprises a shelf abutting the bottom surface of said one of the air filters.

10. The processing system of claim 1, wherein said insulating cover comprises an outer plate of stainless steel and an inner plate of a synthetic resin.

* * * * *